United States Patent
Simoni

(10) Patent No.: US 6,486,710 B1
(45) Date of Patent: Nov. 26, 2002

(54) DIFFERENTIAL VOLTAGE MAGNITUDE COMPARATOR

(75) Inventor: Steve S. Simoni, Roseville, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/895,454

(22) Filed: Jun. 29, 2001

(51) Int. Cl.[7] .................................................. H03K 5/22
(52) U.S. Cl. ............................ 327/63; 327/65; 327/68; 327/71; 327/74
(58) Field of Search ............................. 327/17, 50, 52, 327/56, 58, 63–65, 68, 69, 71, 74, 75, 80, 81, 89

(56) References Cited

U.S. PATENT DOCUMENTS

| | | | |
|---|---|---|---|
| 4,367,420 A | | 1/1983 | Foss et al. .................... 326/119 |
| 5,003,556 A | | 3/1991 | Curtis et al. ................. 375/105 |
| 5,142,244 A | * | 8/1992 | Glica et al. .................. 330/253 |
| 5,285,481 A | * | 2/1994 | Tran ............................ 375/103 |
| 5,303,408 A | * | 4/1994 | Ghomeshi et al. ........... 455/222 |
| 5,327,465 A | * | 7/1994 | Wincn et al. ................ 375/104 |
| 5,396,131 A | * | 3/1995 | Miki et al. ...................... 327/65 |
| 5,675,614 A | | 10/1997 | Wetters ....................... 375/351 |
| 6,069,495 A | | 5/2000 | Ciccone et al. ............... 326/98 |
| 6,127,854 A | * | 10/2000 | Illegems ........................ 327/66 |

* cited by examiner

Primary Examiner—Timothy P. Callahan
Assistant Examiner—Hai L. Nguyen
(74) Attorney, Agent, or Firm—Blakely, Sokoloff, Taylor & Zafman, LLP

(57) ABSTRACT

A differential voltage magnitude comparator to receive a differential input signal and a differential reference signal, in which a magnitude difference of the differential input signal is compared to the magnitude reference of the differential reference signal. An output state depends on the magnitude difference of the differential input signal to the magnitude difference of the differential reference signal. If the magnitude difference of the differential input signal is below the magnitude difference of the differential reference signal, the output is in one state, but if the magnitude difference of the differential input signal is above the magnitude difference of the differential reference signal, the output is in the other state. The comparison and logical operation to provide the output states are generated in single stage.

23 Claims, 4 Drawing Sheets

DIFFERENTIAL VOLTAGE MAGNITUDE COMPARATOR

FIELD OF THE INVENTION

The present invention relates to the field of semiconductor circuits and more particularly to a comparator circuit.

BACKGROUND OF THE RELATED ART

A comparator circuit is utilized for many applications. In general a comparator receives two inputs and generates an output based on the comparison of the two input signals. The comparison is typically looking at the amplitude or magnitude of the input voltages. A differential voltage magnitude comparator is a type of a comparator in which two differential input signals are provided to the comparator and a differential output is generated from the comparator. In one application one of the differential inputs is a reference signal. For example if the reference signal is a steady state voltage value the reference input then can be used to elevate the signal level of one of the other differential inputs for performing the comparison.

For example, a differential comparator can be used to detect squelch (or unsquelch) for a receiver coupled to receive an input signal. For example, such a receiver can be coupled to a communication line or bus to discern when valid traffic is present on the line. When the traffic is sent over a single differential pair the presence of valid traffic is defined by the voltage difference between the pair of data lines comprising the differential pair. The state in which traffic is present is defined as the unsquelch state while the absence of traffic is defined as the squelch state. A comparator circuit can be used to identify the squelch/unsquelch states.

The present invention provides for a differential voltage magnitude comparator in which one of the applications of the comparator of the present invention is to perform the squelch/unsquelch detection.

DETAILED DESCRIPTION OF THE INVENTION

Figure 1:
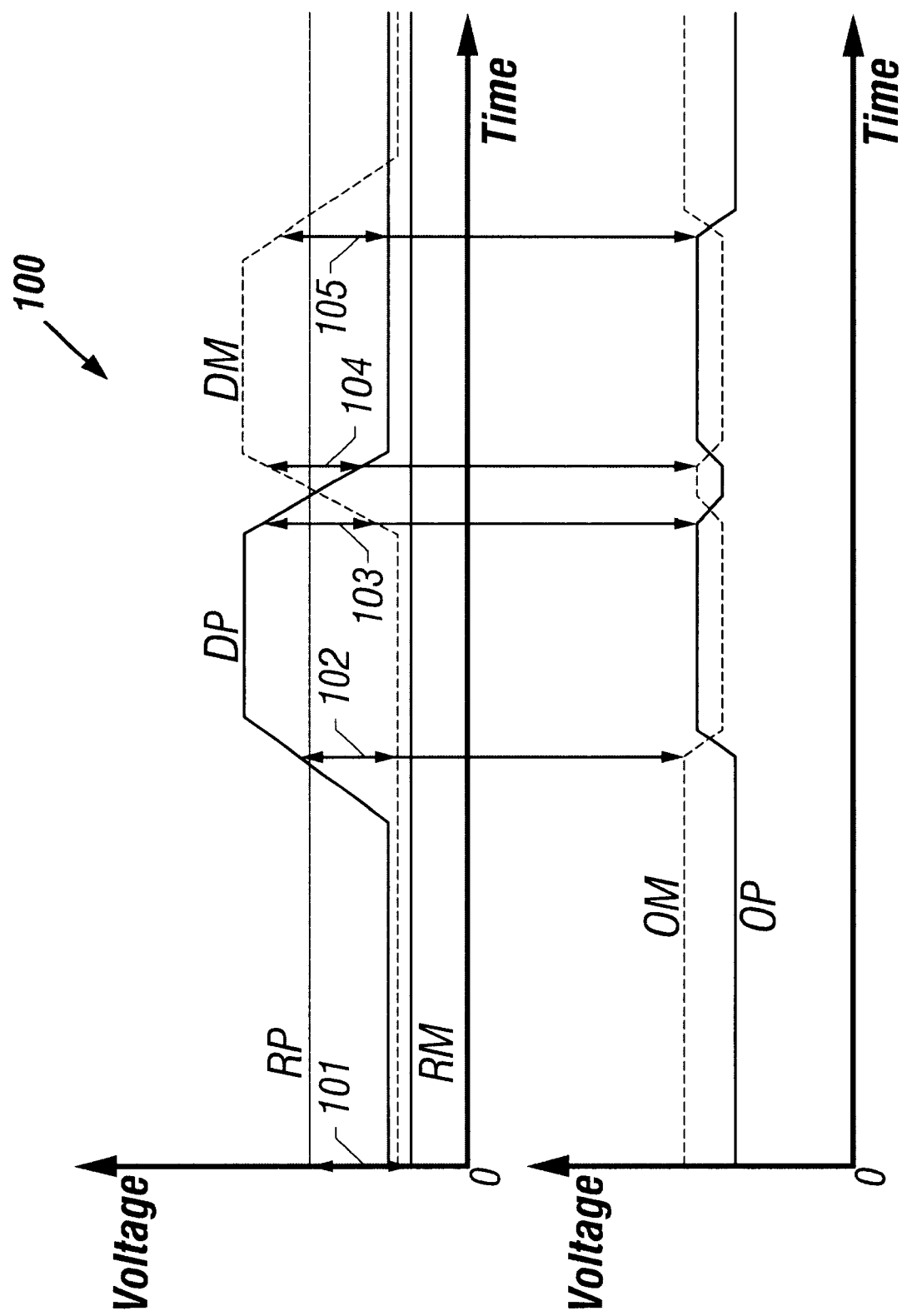
FIG. 1 shows a waveform diagram showing how two pairs of differential input signals are processed to provide a differential output that performs differential voltage magnitude comparison of the input signals.

Referring to FIG. 1, a graphical illustration 100 of a function of an embodiment of a differential voltage magnitude comparator of the present invention is shown. In a voltage versus time representation, the upper portion of the graphical illustration 100 shows signal levels for two pairs of differential inputs. In the bottom portion of the graphical illustration 100, signal levels for the differential output pair from the comparator is illustrated. As noted, the example embodiment of the differential voltage magnitude comparator receives two differential input signal pairs and generates a differential output signal pair. The input signal pair are labeled DP and DM as one differential input signal and RP and RM define the second differential input to the comparator. In this particular embodiment, the RP and RM differential input are steady state voltage values used as a reference value. Also in the particular example, RP and RM are coupled to first set of differential input terminals. Likewise, DP and DM are coupled to second set of differential input terminals. Thus as shown, the RP and RM signals are utilized as reference voltages while the DP and DM signals indicate varying signal levels at the input.

The lower portion of the illustration shows the differential output pair, noted as OP and OM. The differential output OP/OM is dependent on the difference in the value between the DP and DM inputs. Whenever the differential voltage magnitude between DP and DM is greater than the differential between RP and RM, OP assumes a greater voltage than OM. However, whenever the differential voltage magnitude between DP and DM is less than the reference differential between RP and RM, OM assumes a greater voltage than OP. This relationship is illustrated in FIG. 1.

In the upper portion of the graph, the differential value between RM and RP is noted by arrow 101. Accordingly when the signals DP and DM are approximately the same value the output has OM higher than OP. When DP increases in amplitude, a point is reached when the difference in the amplitude between DP and DM equals the difference between RP and RM. As this point, which is shown by arrow 102, OP commences to become greater than the output OM. The output state transition again occurs when the DP/DM differential starts to become less than the RP/RM differential as shown by arrow 103.

A similar transition of OP and OM occurs again when DM increases in amplitude where the differential between DM and DP is greater than RP and RM, as shown by arrow 104, and the subsequent transition, as shown by arrow 105, when the DM/DP differential less than the RP/RM differential. Thus from the diagram of FIG. 1, it is to be noted that the output state is dependent on the differential voltage magnitude value between DP and DM. That is, OP is greater than OM whenever DP/DM (also DM/DP) differential magnitude is greater than the RP/RM differential.

It is appreciated that the input voltage waveforms for the DP and DM signals are representative of signal states encountered on one type of differential set of data lines. The presence of valid traffic on the differential pair of lines is defined by the voltage difference between the line having the positive data (DP) and the line having the negative data (DM). That is, the voltage relationship between DP and DM signify two valid data states. However, when data is not present on the data lines, both DP and DM lines have a low voltage state. When positive data (one data state) is present, the DP line increases in magnitude while the DM line stays at the low state. Alternatively when negative data (second data state) is present, the DM line increases in voltage while the DP line remains at the lower voltage. Thus, in one application the presence of valid traffic is defined as DP and DM having an absolute voltage differential of at least 150 millivolts (mV) while the absence of traffic is defined as DP and DM having an absolute voltage differential of less than 100 mV. Accordingly a reference voltage (noted here in as RP/RM) can be established at some intermediate level to identify the switching point. In the example, approximately 125 mV is used to identify the switching point.

In one application, a detector coupled to the differential data pair will determine when there is data traffic on the data lines (unsquelch condition). That is, the state in which traffic is present is defined as the unsquelch state. A receiver is responsive to receive data in the unsquelch state. When traffic is absent on the data lines, this state is defined as the squelch state. As noted in FIG. 1, the squelch and unsquelch states can be identified by the state of the OP and OM outputs. When OM is greater than OP a squelch condition is noted. However, when there is traffic on the line, OP will be greater than OM at the output. Thus, whenever OP is greater than OM, an unsquelch condition is noted.

If a receiver employing the detector performs the signal processing as shown in FIG. 1, the presence of traffic is noted by the state of the OP/OM pair. When the unsquelch condition is noted, the detector can activate receiver circuitry in order to capture the data present on the data lines.

A variety of embodiments can be implemented to achieve the differential voltage magnitude comparator to practice the present invention. One application of the magnitude comparator was noted in the waveform diagrams of FIG. 1 wherein the output of the comparator has one state when the differential magnitude between DP/DM is below a reference value and the output takes on a second state when the differential value between DP/DM exceeds the reference value.

Figure 2:
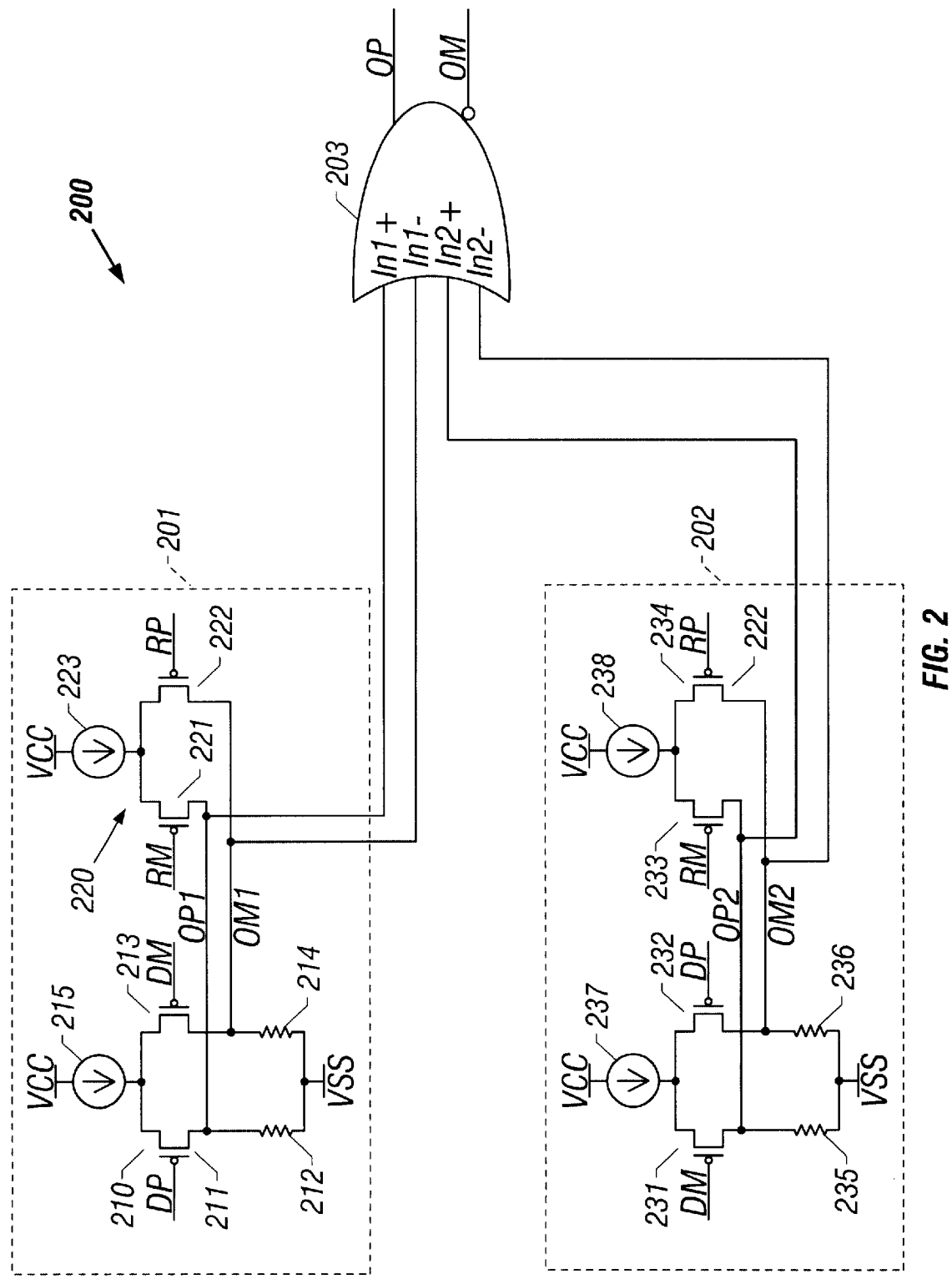
FIG. 2 shows a circuit schematic diagram of performing the comparison noted in FIG. 1.

Referring to FIG. 2, one circuit embodiment 200 to obtain the desired output is shown. The input signals DP, DM, RP and RM, as well as the output signals OP and OM, are also noted as respective inputs and outputs for the circuit shown in FIG. 2. The example circuit of FIG. 2 is comprised of two separate differential comparator circuits 201 and 202 in which their interim outputs, designated OP1 and OM1 for comparator 201 and OP2 and OM2 for comparator 202, are coupled as differential inputs into a differential OR gate 203.

Circuit 201 is comprised of two parallel portions or sections 210, 220. Since these two sections are in parallel, they are functionally a single stage from a timing perspective. Section 210 is comprised of two parallel branches, the first branch comprised of transistor 211 in series with a resistor 212. The second branch is comprised of a transistor 213 in series with a resistor 214. Although the circuit implementation is a design choice, in the particular example shown, transistors 211, 213 are P-type metal-oxide-semiconductor (MOS) devices, hereinafter referred to as PMOS transistors. Thus, sources of transistors 211, 213 are coupled together to VCC. In the example circuit 200, a current source 215 is shown in the source branch to VCC to designate that a substantially constant current is sourced to transistors 211, 213. The gate of transistor 211 is coupled to receive one of the DP/DM differential pair. In this instance the signal DP is coupled to the gate of transistor 211. The gate of transistor 213 is coupled to receive the other differential signal DM. The drain of transistor 211 is coupled to resistor 212 and to the interim output line OP1. The drain of the transistor 213 is coupled to the other differential output line OM1 as well as to resistor 214. The opposite terminal of the resistors 212, 214 are coupled to the VCC return, which is noted as VSS in the example.

The second section 220 is also comprised of two parallel transistors 221, 222. Transistors 221, 222 are also PMOS transistors having their sources coupled together to VCC. Similarly, a current source 223 is shown to designate that a substantially constant current is sourced to transistors 221, 222. The differential pair of transistors 221, and 222 are coupled to receive the other differential pair of signals, which in the example illustration of FIG. 1 is a constant reference voltage. Signal RM is coupled to the gate of transistor 221 and signal RP is coupled to the gate of transistor 222. The drain of transistor 221 is coupled to the interim output OP1 and the drain of transistor 222 coupled to the interim output OM1. As noted in the drawing, resistors 212, 214, are also coupled to the respective drains of transistors 221, 222. In operation, the two sections 210, 220, having common voltage dropping resistors 212, 214, operate to provide voltage magnitude comparison only when DP is greater than DM by an amount greater than the reference value established by the differential of RP/RM. The interim outputs OP1 and OM1 are coupled to one set of differential inputs of the differential OR gate 203.

The second comparator 202 operates equivalently to the comparator 201. Therefore, PMOS transistors 231–234, resistors 235, 236 and current sources 237, 238 are coupled equivalently to respective components 211, 213, 221, 222, 212, 214, 215, 223. However, in this instance, DM is coupled to the gate of transistor 231 while DP is coupled to the gate of transistor 232. That is, the DP/DM connections are reversed from the circuit 201. The interim differential output lines are designated OP2 and OM2 for comparator 202. The differential output of the comparator in this instance will detect the case when DM is greater than DP by an amount greater than the differential of RP/RM. The interim outputs OP2/OM2 are then coupled as inputs to the second differential inputs of the differential OR gate 203. The differential output from the OR gate 203 are designated OP and OM.

When the circuit of FIG. 2 is subjected to the input signal levels noted in FIG. 1, the differential output from the OR gate 203 corresponds to the output waveform OP/OM also shown in FIG. 1. Thus, comparator 201 detects one portion of the unsquelched state when DP is greater than DM by the reference amount and comparator 202 detects the other portion of the unsquelched state when DM exceeds DP by the reference value.

Figure 3:
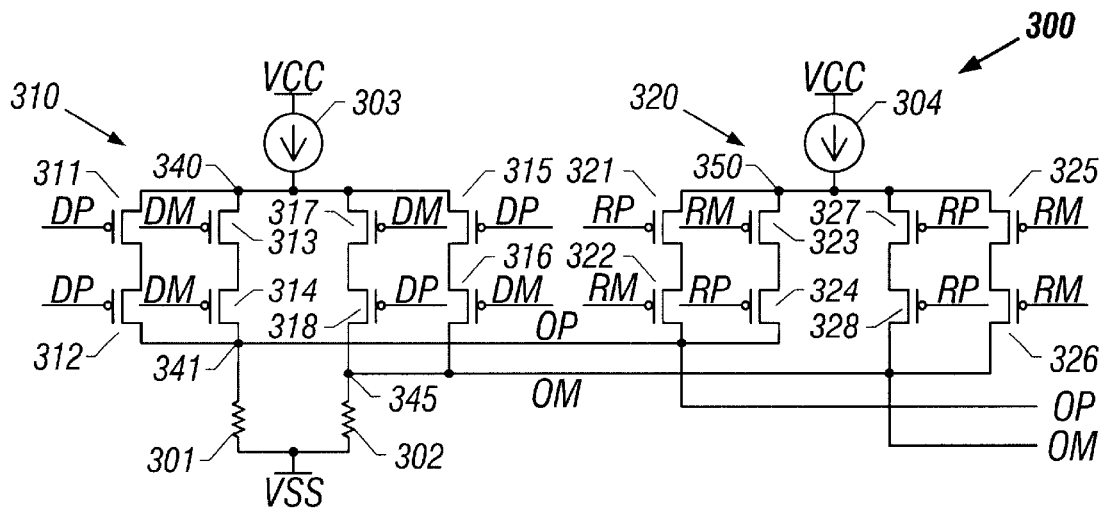
FIG. 3 shows a circuit schematic diagram of an embodiment of the present invention in which one comparator stage is used to perform the comparison and ORing noted in FIG. 1.

Although the embodiment shown in FIG. 2 provides the differential voltage magnitude comparison, two separate comparators 201, 202 and OR gate 203 are required to perform the function. The circuit embodiment illustrated in FIG. 3 provides both comparisons as well as the ORing function in a single circuit stage. Accordingly the circuit 300 shown in FIG. 3 performs the equivalent function of the circuit of FIG. 2 but within a single comparator stage.

Referring to FIG. 3, circuit 300 for performing a differential voltage magnitude comparison of DP and DM is shown. The circuit 300 is comprised of the DP/DM section 310 and the RP/RM section 320. Section 310 is comprised of transistors 311–318. In the particular circuit, transistors 311–318 are PMOS transistors. The differential outputs OP and OM are obtained by voltage drops across load resistors 301 and 302, respectively. Resistor 301 is disposed between the output OP (at node 341) and VSS and resistor 302 is disposed between the output OM (at node 345) and VSS.

In the circuit 300, the transistors 311–318 are disposed into four branches of two transistors each. The transistors are in parallel between VCC and one or the other of the output lines OP/OM. A current source 303 is shown coupled between VCC and the transistor branches (at node 340). The current source 303 depicts a substantially constant current, which is provided to the transistors. Transistors 311, 312 are coupled in series between the current source 303 and the output line OP. Transistors 313, 314 are coupled in series between the same two nodes 340, 341 to form the second branch of the circuit. Transistors 315, 316 are coupled in series between the current source 303 and the output line OM to form the third branch, while transistors 317, 318 are coupled in series between the same two nodes 340, 345 to form the forth branch.

As noted, current source 303 is coupled to VCC while the opposite terminal of the resistors 301, 302 are coupled to VSS. The DM and DP connections are made to the gates of the transistors 311–318 as shown in the diagram. Thus, DP is coupled to the gates of transistors 311, 312, 315, 318. DM is coupled to the transistors 313, 314, 316, 317. The output OP is obtained at the node 341 of the drains of transistors 312, 314 and resistor 301. The output OM is obtained at the node 345 of the drains of transistors 316, 318 and resistor 302.

Likewise the RP/RM section 320 also comprises PMOS transistors 321–328 in the same arrangement as section 310. Similarly a current source 304 is coupled to VCC to provide a substantially constant current to the four branches of the transistors 321–328 (at node 350). The drains of transistors 322 and 324 are coupled to the output line OP as well as to the voltage dropping resistor 301. Likewise, the drains of transistors 326 and 328 are coupled to the output line OM, as well as to the voltage dropping resistor 302. Furthermore, as noted on the schematic diagram RP is coupled to the gates of transistors 321, 324, 327, 328. RM is coupled to the gate transistors 322, 323, 325, 326. As noted, the section 310 is utilized for processing DP/DM while section 320 is utilized for providing the switching point reference voltage RP/RM.

The circuit 300 of FIG. 3 has an advantage in that a single circuit stage provides both comparator functions as well as the ORing function noted with the circuit 200 of FIG. 2. The first stage 310 functions to achieve two states. A first state is achieved when DP equals DM. In this instance, all eight transistors 311–318 have the same voltage on their gates. Thus, the current into node 341 is equal to the current into node 345. As a result, OM equals OP. A second state is achieved when DP is not equal to DM, in which event, the respective gate voltages are not equal. As a result, one set of transistors (either 311, 312 or 313, 314) provides a low impedance path for the current source 303. However, at the same time, the other path set, comprised of transistors 315, 316 or 317, 318, no longer provide a low impedance path. Therefore, more current flows through node 341 than through node 345. The result is that the output OP is higher than OM.

The second stage 320 provides the current offset to the stage 310 that is directly proportional to the differential magnitude of the RP/RM lines. Only the magnitude is of concern, since RP can be greater than RM or RM can be greater than RP. Because the stage 320 is arranged similar to stage 310, it operates in a similar manner. With a difference in voltage between RP and RM, which is established by the reference voltage, stage 320 causes additional current flow to node 345. With both stages 310, 320 present, OP only overcomes OM when the current offset by stage 320 has been overcome by stage 310, which introduces a greater offset on node 341 over node 345. This occurs when the differential voltage at the input of stage 310 is greater than the differential voltage at the input of stage 320.

The reason stage 320 is implemented similar to stage 310 is that the voltage difference between RP/RM is amplified by the same amount as the difference between DP/DM. This allows for the trip point of the circuit to be set by the difference between RP and RM. No scaling is needed if the transistors are designed alike. That is, if the sixteen transistors 311–318, 321–328 are of the same type and size, scaling is not needed. Additionally, process, voltage and temperature (PVT) variations are compensated, so the circuit will operate effectively over a wide range of PVT variations.

As noted, an advantage of circuit 300 is that the circuit is balanced and has symmetry. In design, all of the transistors 311–318 and 321–328 are substantially identical transistors. Both sections 310, 320 have the same circuit arrangement of transistors. Furthermore, for each section, there are equal number of transistors in equal number of branches coupled to each of the output nodes. Each pair of input signals are also coupled in similar fashion in both section 310, 320. Thus, transistors 311 and 312 receive the DP signal while transistors 325 and 326 receive the RM signal. Likewise transistors 313, 314 are coupled to receive the DM input while transistors 327, 328 are coupled to receive the RP input. At the other portion of each circuit, transistors 317, 318 are coupled to receive the DM and DP signals while transistors 323, 324 are coupled to receive RM and RP signals. The DP and DM inputs are reversed with transistors 315, 316 as are the RP and RM signals with transistors 321, 322. Thus, signal and circuit symmetry are achieved with balanced transistors of the circuit 300.

Figure 4:
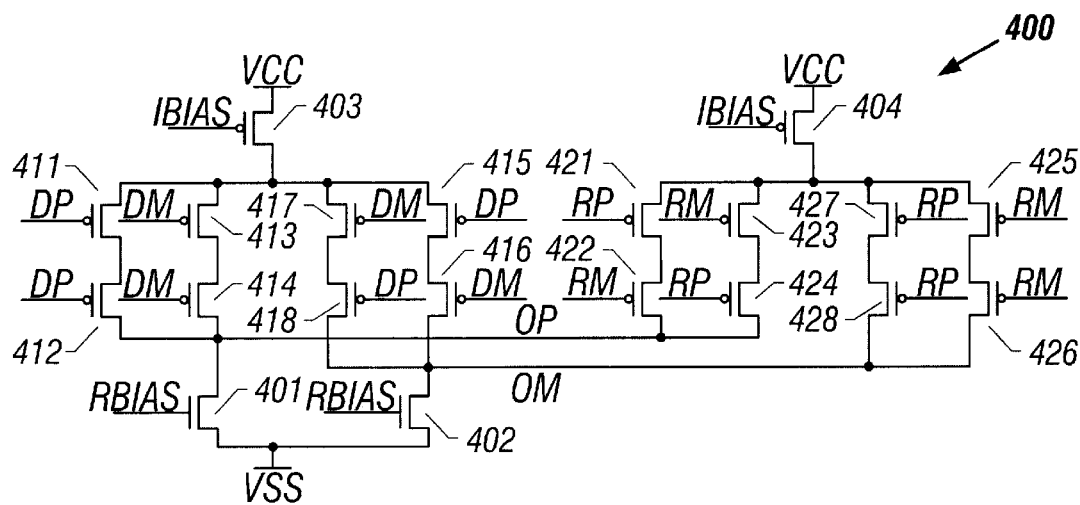
FIG. 4 shows a circuit schematic diagram of an embodiment of the present invention in which bias signals are used to control resistance and current for the circuit embodiment shown in FIG. 3.

Referring to FIG. 4, a circuit 400 is shown. The circuit 400 is equivalent to the circuit 300 of FIG. 3 is shown but in this instance the resistors 301, 302 are replaced by active components, in this example, transistors 401, 402. As noted transistors 401, 402 are NMOS transistors. A $R_{BIAS}$ signal is coupled to the gates of both transistors 401, 402 in order to bias these two transistors as active resistive loads. Similarly transistor 403 is inserted for the current source 303 to provide an active component for maintaining the current and substantially constant. Likewise transistor 404 is inserted for the current source 304. Both transistors 403, 404 are PMOS transistors. As noted an $I_{BIAS}$ signal is coupled to the gates of transistors 403, 404 in order to bias these two transistors to provide the substantially constant current. It is noted that various other devices can be inserted in order to provide equivalent functions of resistors 301, 302 and sources 303 and 304.

Figure 5:
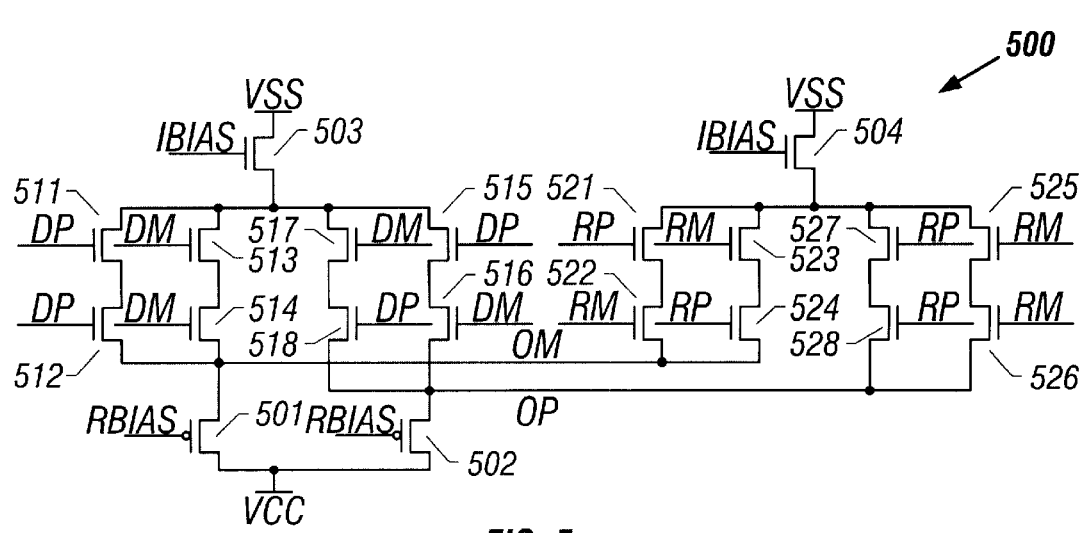
FIG. 5 shows a circuit schematic diagram equivalent to the circuit of FIG. 4, but in which N-type and P-type transistors are reversed.

It is to be noted that the circuits 300, 400 can be implemented in a variety of ways. For example, an NMOS equivalent circuit 500 to that of the PMOS transistor circuit 400 of FIG. 4 is shown in FIG. 5. Accordingly transistors 511–518, which correspond to transistors 411–418 in FIG. 4, are NMOS transistors. Likewise transistors 521–528, which correspond to transistors 421–428 of FIG. 4, are NMOS transistors. The N-P reversals are also done with the devices 401–404, such that transistors 501, 502 are PMOS transistors, while transistors 503, 504 are NMOS transistors. Due to the device reversal, the OP and OM output lines are also reversed, such that OM is coupled to transistor 501 while OP is coupled to transistor 502. Furthermore, it is to be noted that VCC is coupled to the transistors 501, 502 and VSS is now coupled to the transistors 503, 504. The functional equivalence of the circuit 500 is equivalent to that of circuit 400 of FIG. 4.

Figure 6:
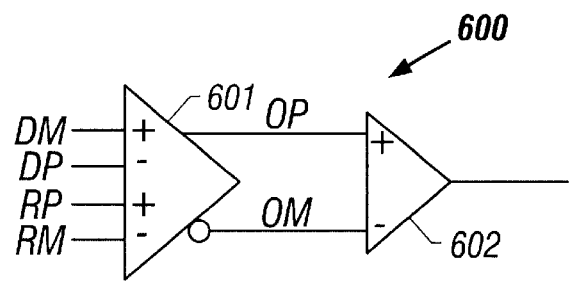
FIG. 6 shows a block schematic diagram showing an embodiment of the present invention in which the comparisons and ORing functions are performed in one stage and the differential output converted to single-ended output.

The resulting functional block diagram 600 of the circuits 300, 400, 500 is shown in FIG. 6 wherein a single stage differential voltage magnitude comparator 601 also provides the differential ORing function to provide the OP/OM output. If desired, differential to single ended conversion can be performed by use of an amplifier 602 to generate a single ended output corresponding to the state change of OP and OM.

Figure 7:
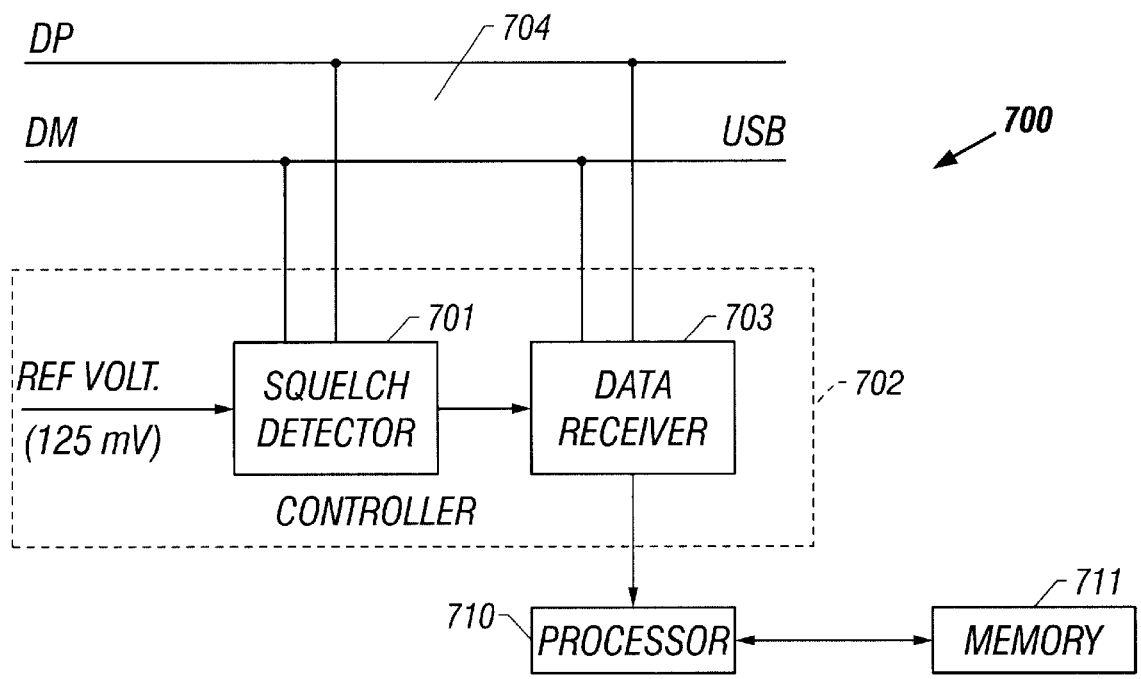
FIG. 7 shows a block schematic diagram of a system embodiment in which the present invention is embodied in a squelch detector to identify when data is present on a USB compliant system.

Although the differential voltage magnitude comparator of the present invention can be utilized in a variety of uses, one application utilizes the invention to provide a squelch detector. Thus, as shown in FIG. 7 a detector 701, incorporating the differential voltage magnitude comparator of the present invention, is shown. The detector 701 is shown as part of a system 700, although the detector 701 can be used in various other applications. In the example, the detector 701 is part of a controller 702, which also includes a data receiver 703. As noted, the controller 702 is coupled to a differential set of data lines 704. For example, differential pair 704 can be a Universal Serial Bus (USB), such as USB 2.0, so that the controller 702 is a USB compliant device. The two lines of the USB provide the DP/DM signals.

The controller 702 includes the detector 701 and a data receiver 703. The detector operates to activate the receiver to receive data when an unsquelch condition is detected on the data lines 704. A reference voltage is shown coupled to the squelch detector to establish the state switching point. As was described in the earlier example, a 125 mV reference is shown in FIG. 7.

The receiver is activated when it receives the signal from the detector 701, indicating an unsquelch state. The data is received for by the controller 702 and transferred to other units. In the particular example system 700 shown, a processor 710 is coupled to the controller 702. The data is transferred to the processor 710 for processing or handling. A memory 711 is also shown couple to the processor 710 to designate that the captured data can be stored in the memory 771 as well for later use. It is appreciated that the system 700 is shown in it's simplest form and that most computer systems have many more components other than what is shown in FIG. 7. Furthermore, the detector 701 can be included as part of the receiver 703. The present invention, including the matched differential pair circuit embodiments described herein, can be readily used in the squelch detector 701 to detect the state of the DP and DM lines in order to active the receiver for capturing data when ever data is present on the communication line.

Additionally, it is to be noted that the examples above presented a substantially constant reference source for the RP/RM differential. However, the invention can be adapted to function with a variable RP/RM signal for those applications which may desire the use of having a variable reference magnitude for RP/RM. Furthermore, the invention can be adapted to use in an analog application to determine the difference between two analog lines regardless of polarity.

Thus, a differential voltage magnitude comparator is described.

I claim:

1. An apparatus comprising:
   a first comparator coupled to receive a differential input signal, said first comparator to have parallel branches of active components in which pair of input lines for the differential input signal are separately coupled to first and second branches respectively, but both pair of input lines are coupled to third and fourth branches;
   a second comparator coupled to receive a differential reference signal, said second comparator to have parallel branches of active components in which pair of reference lines for the differential reference signal are separately coupled to fifth and sixth branches respectively, but both pair of reference lines are coupled to seventh and eighth branches,
   said first and second comparators coupled to provide an output in which the output is in a first state if a differential magnitude between the two input lines of the differential input signal is below a reference magnitude established by the differential reference signal, but the output is in a second state if the differential magnitude between the two input lines of the differential input signal is above the reference magnitude, said two comparators arranged to provide the comparison and output in a single stage.

2. The apparatus of claim 1 wherein said two comparators are comprised of similar active components in the eight branches and in which a pair of load resistance are also coupled to the output, the active components arranged to have symmetry of said two comparators to generate the output.

3. The apparatus of claim 1 wherein said differential reference signal is a constant voltage level so that the reference magnitude is maintained substantially constant.

4. The apparatus of claim 3 wherein the voltage level is selected at approximately between 100 millivolts to 150 millivolts, so that the output is in the first state if a value of the differential input signal is below the selected voltage level, but the output is in the second state if a value of the differential input signal is above the selected voltage level.

5. The apparatus of claim 3 wherein the differential input signal is a data signal received from a differential serial bus coupled to the input lines.

6. The apparatus of claim 3 wherein the differential serial bus is a Universal Serial Bus.

7. A circuit comprising:
   a first transistor and a second transistor coupled in series between a first supply node and a first output node;
   a third transistor and a fourth transistor coupled in series between the first supply node and the first output node;
   a fifth transistor and a sixth transistor coupled in series between the first supply node and a second output node;
   a seventh transistor and an eighth transistor coupled in series between the first supply node and the second output node;
   a ninth transistor and a tenth transistor coupled in series between a second supply node and the first output node;
   a eleventh transistor and a twelfth transistor coupled in series between the second supply node and the first output node;
   a thirteenth transistor and a fourteenth transistor coupled in series between the second supply node and the second output node;
   a fifteenth transistor and a sixteenth transistor coupled in series between the second supply node and the second output node;
   said first through eighth transistors coupled to receive a differential input signal and said ninth through sixteenth transistors coupled to receive a differential reference signal, said sixteen transistors coupled to provide a differential output at the first and second output nodes in which the output is in a first differential state if a differential magnitude between pair of inputs of the differential input signal is below a reference magnitude established by the differential reference signal, but the output is in a second differential state if the differential magnitude between the pair of inputs of the differential input signal is above the reference magnitude.

8. The circuit of claim 7 wherein one input of the differential input signal is coupled input signal is coupled to gates of said third, fourth, fifth and eighth transistors; one input of the differential reference signal is coupled to gates of said ninth, twelfth, thirteenth and fourteenth transistors; and other input of the differential reference signal is coupled to gates of said tenth, eleventh, fifteenth and sixteenth transistors.

9. The circuit of claim 7 further comprising a first load resistance between the first output node and a supply return and a second load resistance between the second output node and the supply return.

10. The circuit of claim 9 wherein said load resistance at each output node is an active transistor.

11. The circuit of claim 9 further comprising a first current source coupled between the first supply node and a supply voltage and a second current source coupled between the second supply node and the supply voltage.

12. The circuit of claim 8 wherein the differential input signal is a data signal received from a differential serial bus.

13. The circuit of claim 12 wherein the differential reference signal is a voltage level so that the reference magnitude is maintained substantially constant.

14. An apparatus comprising:
   a receiver to be coupled to a differential serial bus to receive data present on the bus;
   a squelch detector coupled to said receiver and also to be coupled to the differential serial bus, said detector including:
      (a) a first comparator coupled to receive the differential serial data as its differential input signal, said first comparator to have parallel branches of active components in which pair of input lines for the differential input signal are separately coupled to first and second branches respectively, but both pair of input lines are coupled to third and fourth branches;
      (b) a second comparator coupled to receive a differential reference signal, said second comparator to have parallel branches of active components in which pair of reference lines for the differential reference signal are separately coupled to fifth and sixth branches respectively, but both pair of reference lines are coupled to seventh and eighth branches,
   said first and second comparators coupled to provide an output in which the output is in a first state if a differential magnitude between the two input lines of the differential input signal is below a reference magnitude established by the differential reference signal, but the output is in a second state if the differential magnitude between the two input lines of the differential input signal is above the reference magnitude, said two comparators arranged to provide the comparison and output in a single stage; and
   said squelch detector activating the receiver to receive data when data is present on the bus.

15. The apparatus of claim 14 wherein said differential reference signal is a constant voltage level so that the reference magnitude is maintained substantially constant.

16. The apparatus of claim 15 wherein the voltage level is selected at approximately between 100 millivolts to 150 millivolts, so that the output is in the first state if a value of the differential input signal is below the selected voltage level, but the output is in the second state if a value of the differential input signal is above the selected voltage level.

17. The apparatus of claim 14 wherein the differential serial bus is a Universal Serial Bus.

18. A method comprising:
   receiving a differential input signal to a four branch comparator in which one input of the differential input signal is coupled to first, third and fourth branches and other input of the differential input signal is coupled to second, third and fourth branches;
   receiving a differential reference signal to another four branch comparator in which the differential reference signal is coupled to fifth, seventh and eighth branches and other input of the differential reference signal is coupled to sixth, seventh and eighth branches;
   comparing a magnitude difference of the differential input signal to the magnitude difference of the differential reference signal;
   generating an output in which the output is in a first state if the magnitude difference of the differential input signal is below the magnitude difference of the differential reference signal, but the output is in a second state if the magnitude difference between the differential input signal is above the magnitude difference of the differential reference signal, the magnitude comparison and output are generated in a single symmetrical stage.

19. The method of claim 18 further including the detecting of data present on a differential data line by coupling the data as the differential input signal.

20. The method of claim 19 further including the detecting of data to provide squelch control to a receiver coupled to receive the data.

21. A system comprising:
   a receiver to be coupled to a differential serial bus to receive data present on the bus, said receiver including a squelch detector to be coupled to the differential serial bus, said detector including:
      (a) a first comparator coupled to receive the differential serial data as its differential input signal, said first comparator to have parallel branches of active components in which pair of input lines for the differential input signal are separately coupled to first and second branches respectively, but both pair of input lines are coupled to third and fourth branches;
      (b) a second comparator coupled to receive a differential reference signal, said second comparator to have parallel branches of active components in which pair of reference lines for the differential reference signal are separately coupled to fifth and sixth branches respectively, but both pair of reference lines are coupled to seventh and eighth branches;
   said first and second comparators coupled to generate an output in which the output is in a first state if a differential magnitude between the two input lines of the differential input signal is below a reference magnitude established by the differential reference signal, but the output is in a second state if the differential magnitude between the two input lines of the differential input signal is above the reference magnitude, said two comparators arranged to provide the comparison and output in a single stage;
   said squelch detector activating said receiver to receive data when data is present on the bus; and
   a processor coupled to said receiver to process the received data.

22. They system of claim 21 further comprising a memory coupled to said processor to store the received data.

23. The system of claim 22 wherein the differential serial bus is a Universal serial bus.

* * * * *